US010020239B2

(12) United States Patent
Tsao et al.

(10) Patent No.: US 10,020,239 B2
(45) Date of Patent: Jul. 10, 2018

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Pei-Haw Tsao, Taichung (TW); Chien-Jung Wang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/993,454

(22) Filed: Jan. 12, 2016

(65) Prior Publication Data

US 2017/0200664 A1    Jul. 13, 2017

(51) Int. Cl.
*H01L 23/31* (2006.01)
*H01L 21/56* (2006.01)
*H01L 23/00* (2006.01)

(52) U.S. Cl.
CPC .......... *H01L 23/3185* (2013.01); *H01L 21/56* (2013.01); *H01L 24/02* (2013.01); *H01L 24/13* (2013.01); *H01L 24/16* (2013.01); *H01L 24/81* (2013.01); *H01L 2224/02377* (2013.01); *H01L 2224/13024* (2013.01); *H01L 2224/16227* (2013.01); *H01L 2224/81815* (2013.01); *H01L 2924/3512* (2013.01)

(58) Field of Classification Search
CPC ..... H01L 23/3185; H01L 21/56; H01L 24/13; H01L 24/16; H01L 24/81; H01L 24/02; H01L 2224/02377; H01L 2224/13024; H01L 2224/16227; H01L 2224/81815; H01L 2924/3512

USPC .................................. 257/737, 777; 438/703
See application file for complete search history.

(56) References Cited

U.S. PATENT DOCUMENTS

| 2009/0166848 | A1* | 7/2009 | Berghof | H01L 23/525 257/700 |
| 2010/0038749 | A1* | 2/2010 | Summerfelt | H01L 21/76877 257/531 |
| 2013/0127052 | A1* | 5/2013 | Tu | H01L 23/3114 257/738 |
| 2013/0299967 | A1  | 11/2013 | Daniels et al. | |

(Continued)

FOREIGN PATENT DOCUMENTS

| JP | 2004274063 A | * | 9/2004 |
| JP | 2009170901 A | * | 7/2009 |

OTHER PUBLICATIONS

Office Action dated Nov. 21, 2017 for the Taiwan counterpart application 105144311.

*Primary Examiner* — Bo Fan
(74) *Attorney, Agent, or Firm* — WPAT, P.C., Intellectual Property Attorneys; Anthony King

(57) ABSTRACT

A semiconductor structure includes a substrate comprising a die pad disposed over the substrate, and a passivation disposed over the substrate and surrounding the die pad, a redistribution layer (RDL) comprising a dielectric layer disposed over the passivation and an interconnect structure disposed within the dielectric layer and electrically connecting with the die pad, a conductive bump disposed over and electrically connected with the interconnect structure; and an isolation layer surrounding the substrate and the RDL.

20 Claims, 16 Drawing Sheets

(56) References Cited

U.S. PATENT DOCUMENTS

| | | | | |
|---|---|---|---|---|
| 2014/0008818 A1* | 1/2014 | Lee | .................. | H01L 24/95 257/777 |
| 2014/0134802 A1 | 5/2014 | Lin et al. | | |
| 2014/0346665 A1* | 11/2014 | Lin | .................. | H01L 23/49811 257/737 |

* cited by examiner

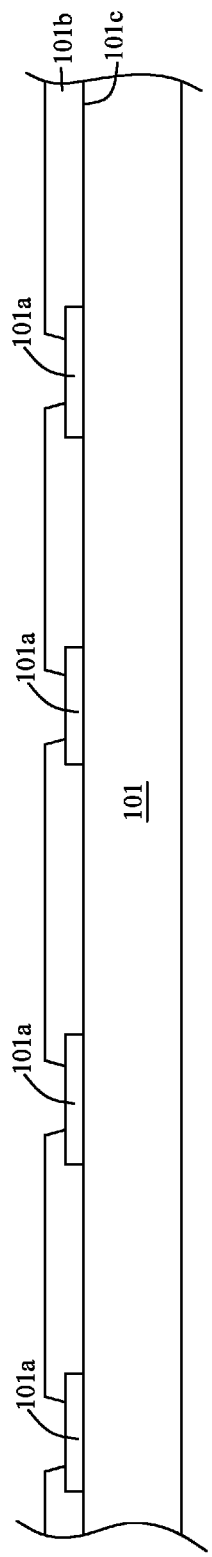
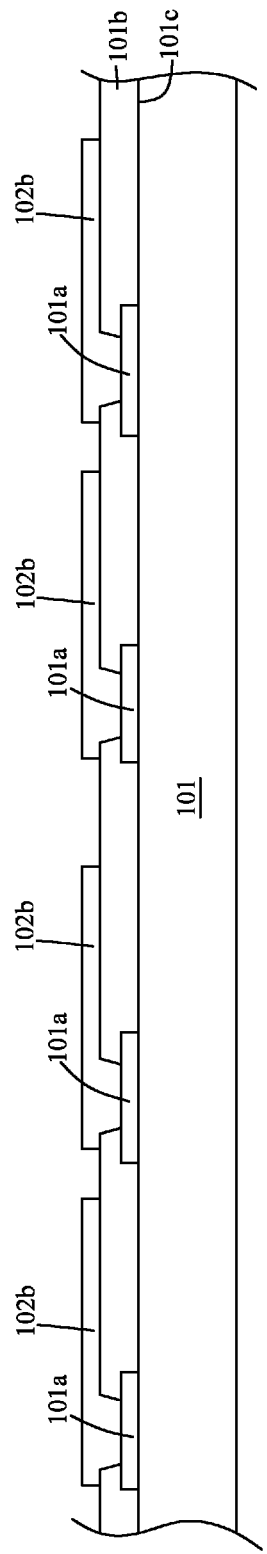

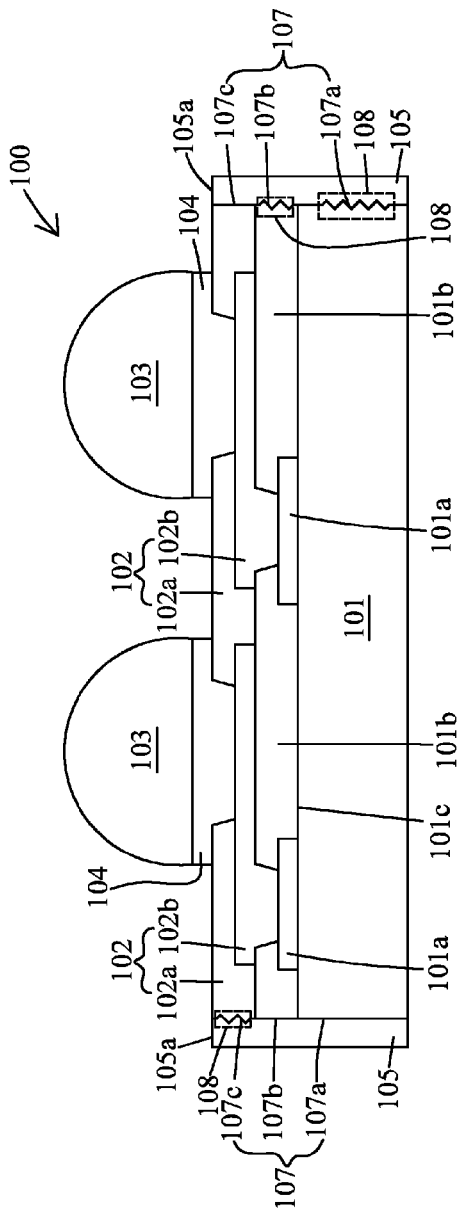
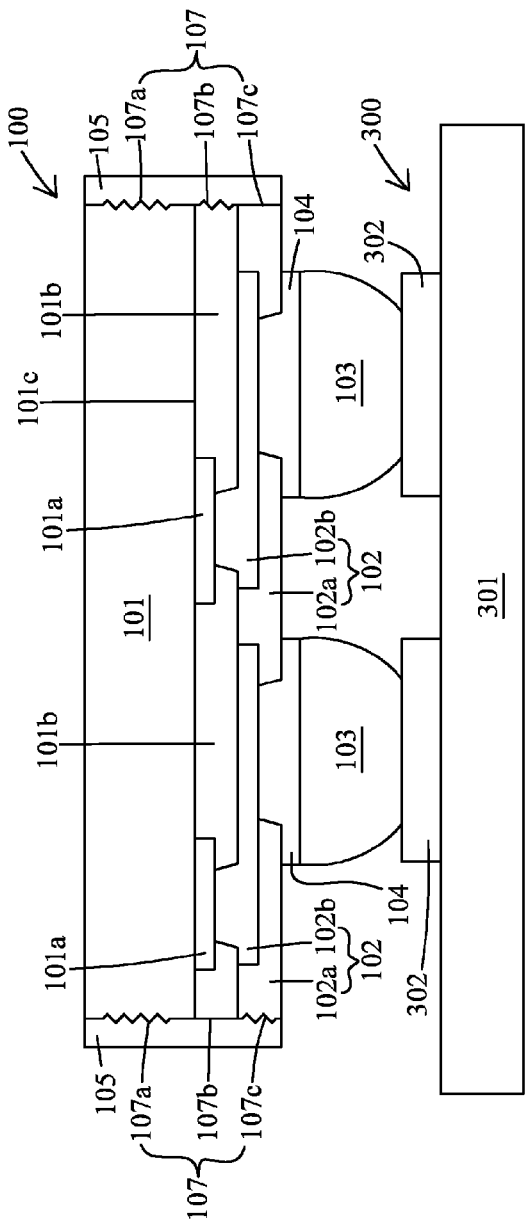
FIG. 5I
FIG. 5J

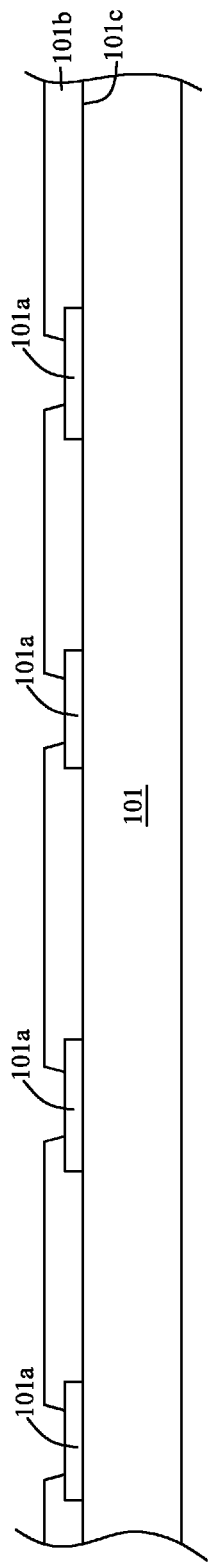
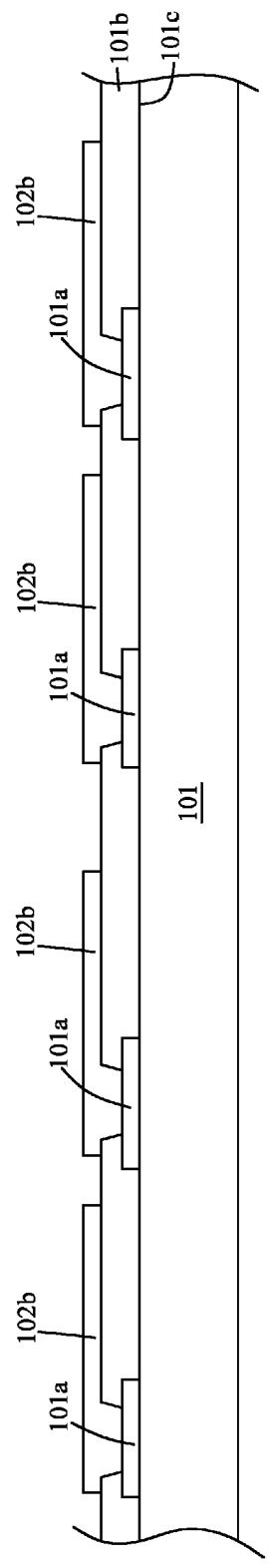

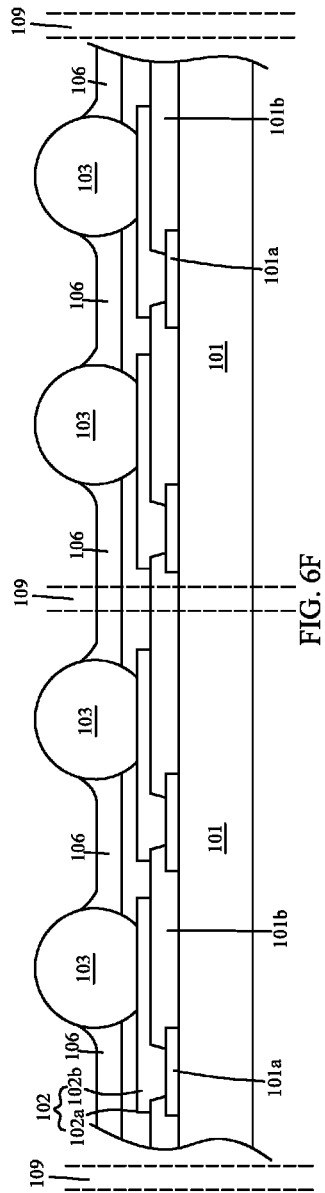
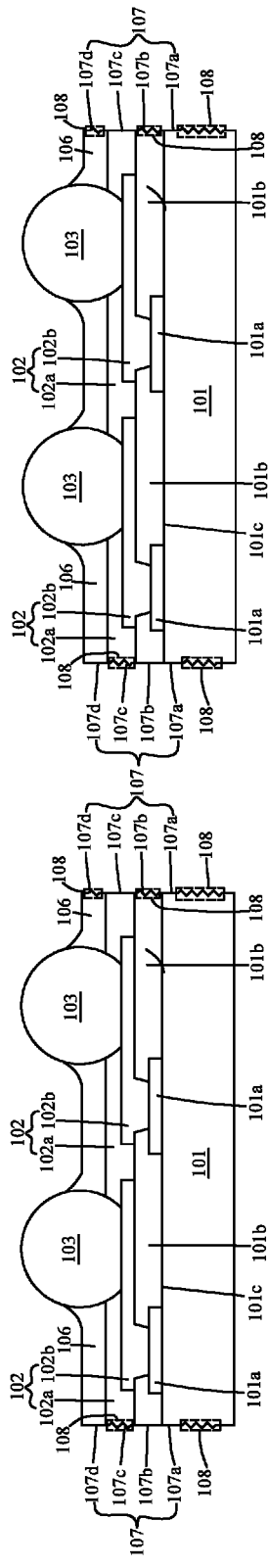

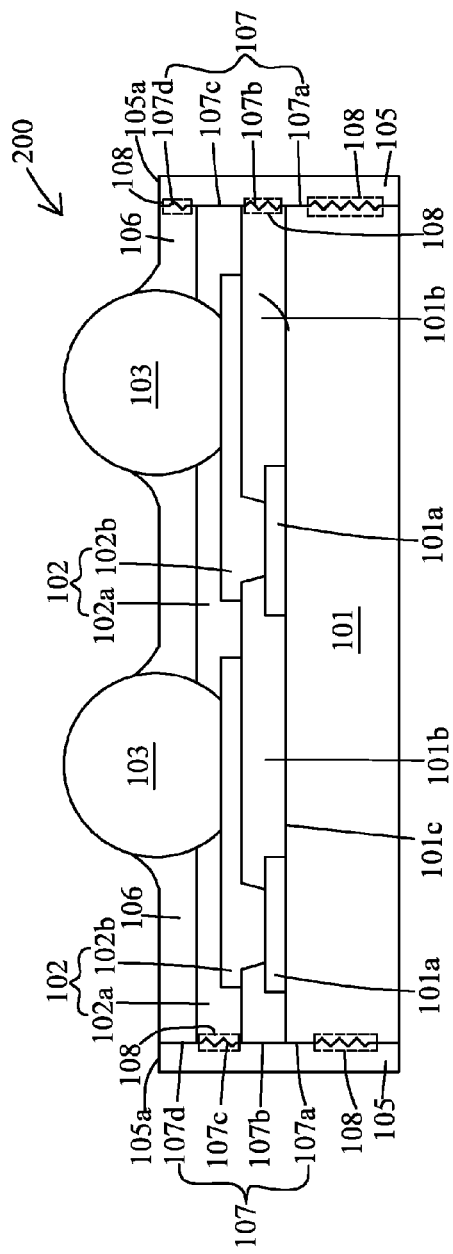
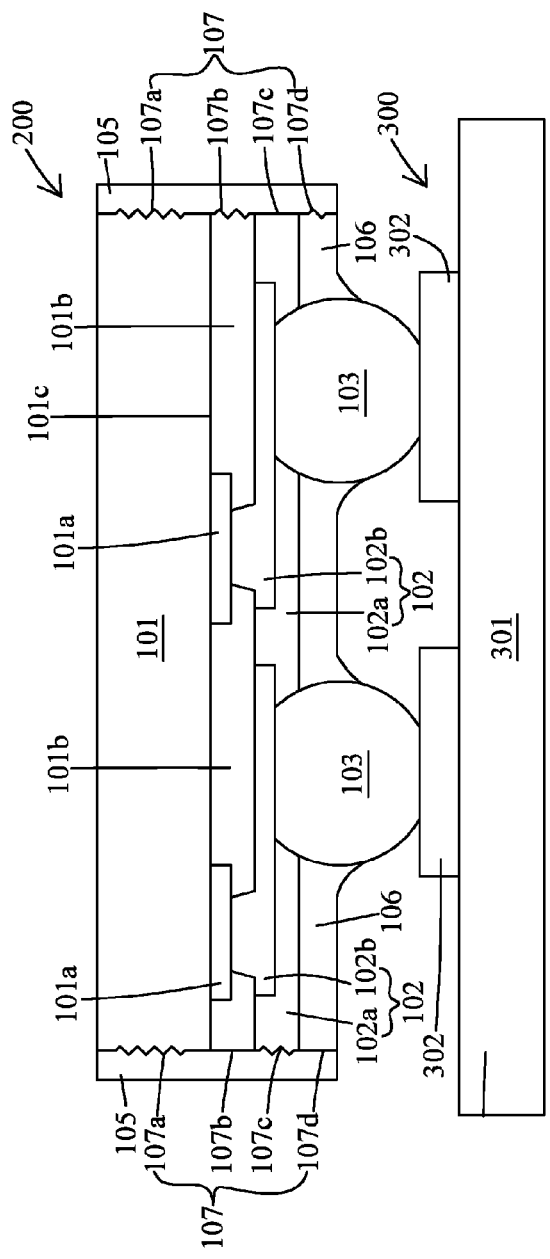

SEMICONDUCTOR STRUCTURE AND MANUFACTURING METHOD THEREOF

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a wafer level packaging (WLP) is widely used for its low cost and relatively simple manufacturing operations. During the WLP operations, a number of semiconductor components are assembled on the semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as inaccurate placement of components, poor electrical interconnection, development of cracks, delamination of the components or high yield loss of the semiconductor device. The semiconductor device is produced in an undesired configuration, which would further exacerbate materials wastage and thus increase the manufacturing cost. As such, there are many challenges for modifying a structure of the semiconductor devices and improving the manufacturing operations.

Since more different components with different materials are involved, a complexity of the manufacturing operations of the semiconductor device is increased. There are more challenges to modify a structure of the semiconductor device and improve the manufacturing operations. As such, there is a continuous need to improve the manufacturing the semiconductor and solve the above deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 5A-5J are schematic views of manufacturing a semiconductor structure by a method of FIG. 5 in accordance with some embodiments of the present disclosure.

FIGS. 6A-6J are schematic views of manufacturing a semiconductor structure by a method of FIG. 6 in accordance with some embodiments of the present disclosure.

DETAILED DESCRIPTION OF THE DISCLOSURE

Figure 1:
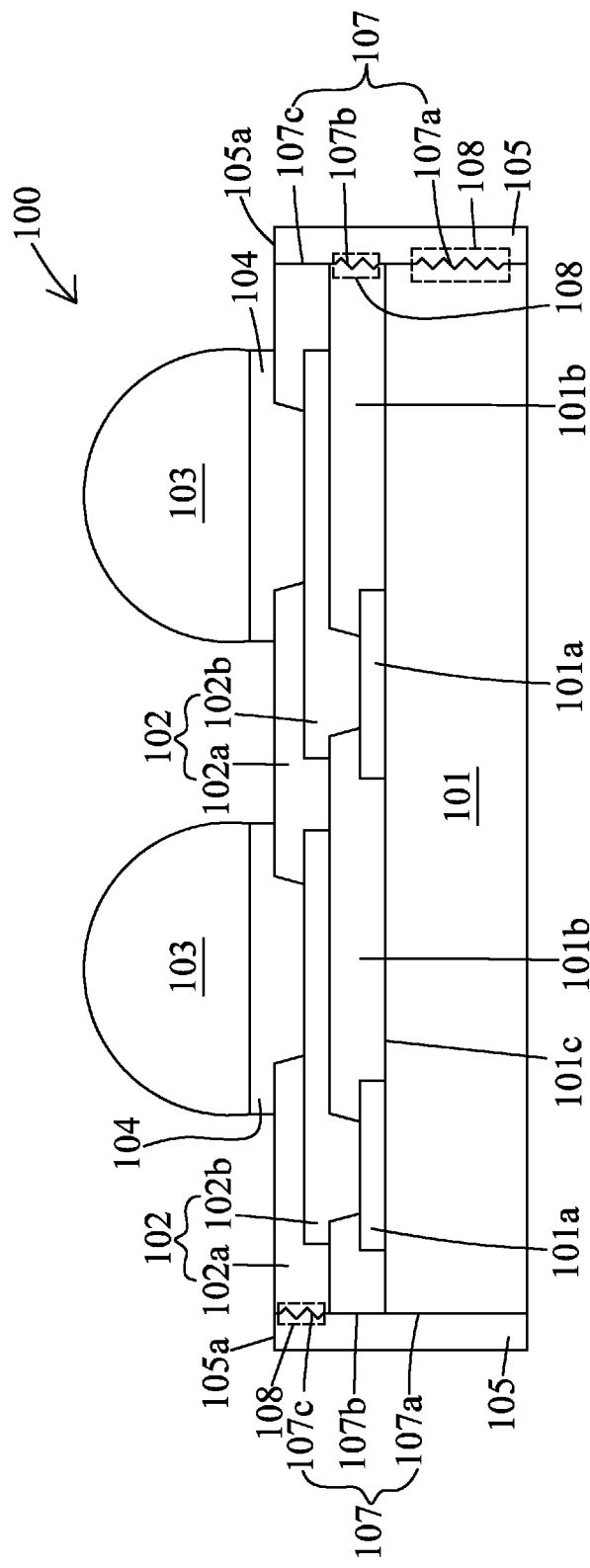
FIG. 1 is a schematic cross-sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor structure is manufactured by a number of operations. The semiconductor structure is manufactured by a wafer. The wafer is defined with several die areas or chip areas. The die areas are separated from each other by several scribe line regions. Several interconnect structures are disposed over the wafer to electrically connect with components over the die areas. Further, several dielectric layers are disposed over the wafer to cover the interconnect structures and the die areas. The wafer is then sawn through layers of the wafer along the scribe line regions to singulate several semiconductor structures from the wafer.

As the wafer has a small size with a complex structure, cracks are easily developed upon the cutting operation along a sidewall of the semiconductor structure. The present of cracks would result in a high stress within the semiconductor structure, and the crack may propagate towards a central portion of the semiconductor structure to further weaken the semiconductor structure. Furthermore, some small chips or fragments are produced during the cutting of the wafer. Those small chips peeled out from the wafer during the cutting operation would temporarily attach on the saw blade or dispose on the sidewall of the semiconductor structure, which would further induce development of cracks over the sidewall of the semiconductor structure. The cracks would affect reliability and performance of the semiconductor structure.

In the present disclosure, a semiconductor structure with a structural improvement is disclosed. The semiconductor structure includes a substrate, a redistribution layer (RDL)

over the substrate and a conductive bump over the RDL. An isolation layer is disposed over a sidewall of the semiconductor structure being sawn upon singulation operation. The sidewall is covered by the isolation layer. Further, several recesses may be present over the sidewall of the semiconductor structure after the singulation operation, and the isolation layer is configured to fill and seal the recesses in order to minimize or prevent propagation of the recesses towards a central portion of the semiconductor structure. As such, a reliability of the semiconductor structure disposed with the isolation layer is improved.

FIG. 1 illustrates a semiconductor structure 100 in accordance with various embodiments of the present disclosure. FIG. 1 is a cross-sectional view of the semiconductor structure 100. In some embodiments, the semiconductor structure 100 includes a substrate 101, a redistribution layer (RDL) 102, a conductive bump 103 and an isolation layer 105. In some embodiments, the semiconductor structure 100 is a wafer level chip scale package (WLCSP). In some embodiments, the semiconductor structure 100 is fabricated by a wafer including semiconductive material such as silicon. Several fabrication operations such as routing are performed over the wafer, and then the semiconductor structure is singulated from the wafer by sawing operations.

In some embodiments, the semiconductor structure 100 is a fan-in device. In some embodiments, a geometric size or a width of the semiconductor structure 100 is similar to a width of the substrate 101. In some embodiments, routing of circuitries of the substrate 101 is disposed over the substrate 101 and within the width of the substrate 101.

In some embodiments, the semiconductor structure 100 includes the substrate 101. In some embodiments, the substrate 101 is a semiconductive substrate fabricated with a predetermined functional circuit over the substrate 101. In some embodiments, the substrate 101 is fabricated for a predetermined application such as micro-processing, dynamic random access memory (DRAM), application-specific integrated circuits (ASIC) or the like. In some embodiments, the substrate 101 includes several conductive lines and several electrical components such as transistor, diode, etc. connected by the conductive lines.

In some embodiments, the substrate 101 includes semiconductive material such as silicon, germanium, gallium, arsenic, or combinations thereof. In some embodiments, a cross sectional area of the substrate 101 is in a quadrilateral, rectangular, square, polygonal or any other suitable shapes.

In some embodiments, the substrate 101 includes a die pad 101a disposed over the substrate 101. In some embodiments, the die pad 101a is electrically connected with the electrical components disposed over or within the substrate 101. In some embodiments, the die pad 101a is configured to receive a conductive structure. In some embodiments, the die pad 101a is disposed over an active side of the substrate 101. In some embodiments, the die pad 101a is disposed over a surface 101c of the substrate 101. In some embodiments, the surface 101c is a top surface of the substrate 101.

In some embodiments, the die pad 101a includes aluminum, copper, nickel, gold, silver, other conductive materials, alloy thereof or multi layers thereof. FIG. 1 illustrates the semiconductor structure 100 including two die pads 101a, however it is understood that the semiconductor structure 100 can include two or more die pads 101a. It is not intended to limit a number of the die pads 101a in the semiconductor structure 100.

In some embodiments, the substrate 101 includes a passivation 101b disposed over the substrate 101 and surrounding the die pad 101a. In some embodiments, the passivation 101b partially covers the die pad 101a, so that a portion of the die pad 101a is exposed for receiving or electrically connecting with a conductive structure. In some embodiments, the passivation 101b is disposed adjacent to a periphery of the die pad 101a. In some embodiments, the passivation 101b is patterned in order to expose the portion of the die pad 101a and thus allow an electrical connection with a conductive structure.

In some embodiments, the passivation 101b is a single layer or more than one layer of dielectric materials disposed or stacked over each other. In some embodiments, the passivation 101b includes dielectric materials such as silicon oxide, silicon nitride, silicon oxynitride, polyimide (PI), benzocyclobutene (BCB), polybenzoxazole (PBO) or other insulating materials.

In some embodiments, the RDL 102 is disposed over the substrate 101. In some embodiments, the RDL 102 is disposed over the die pad 101a and the passivation 101b. In some embodiments, the RDL 102 re-routes a path of a circuit from the die pad 101a to a conductive structure. In some embodiments, the RDL 102 includes a dielectric layer 102a and an interconnect structure 102b surrounded by the dielectric layer 102a. In some embodiments, the RDL 102 is a post passivation interconnection (PPI).

In some embodiments, the dielectric layer 102a is disposed over the substrate 101 and the passivation 101b. In some embodiments, the dielectric layer 102a includes one or more layers of dielectric material disposed or stacked over each other. FIG. 1 illustrates the dielectric layer 102a including one layer of dielectric material, however it is understood that the semiconductor structure can include two or more layers of dielectric material. It is not intended to limit a number of layers of dielectric material in the dielectric layer 102a.

In some embodiments, the dielectric layer 102a includes dielectric material such as silicon oxide, silicon carbide, silicon oxynitride, silicon nitride or the like. In some embodiments, the dielectric layer 102a includes dielectric material such as polymer, polybenzoxazole (PBO), polyimide, benzocyclobutene (BCB), or the like. In some embodiments, the dielectric layer 102a includes the same or a different material from the passivation 101b.

In some embodiments, the interconnect structure 102b is disposed within the dielectric layer 102a and electrically connected with the substrate 101 through the die pad 101a. In some embodiments, the interconnect structure 102b is partially covered by the dielectric layer 102a. In some embodiments, the interconnect structure 102b is configured to electrically connect the substrate 101 with a conductive structure. In some embodiments, the interconnect structure 102b includes an elongated portion disposed over the passivation 101b and a via portion protruded from the elongated portion, extended through the passivation 101b and coupled with the die pad 101a. In some embodiments, the dielectric layer 102a is patterned such that a portion of the interconnect structure 102b is exposed to allow a receipt of or electrical connection with a conductive structure.

In some embodiments, the interconnect structure 102b includes conductive material such as aluminum, copper, nickel, gold, tungsten, titanium, alloys thereof, or multilayers thereof. FIG. 1 illustrates the RDL 102 including two interconnect structures 102b, however it is understood that the semiconductor structure can include two or more interconnect structures 102b within the dielectric layer 102a. It is not intended to limit a number of the interconnect structure 102b in the RDL 102. In some embodiments, several interconnect structure 102b are disposed or stacked over each other, and are interposed between several dielectric layers 102a.

In some embodiments, a connecting pad 104 is disposed over the RDL 102. In some embodiments, the connecting pad 104 is disposed over the dielectric layer 102a and the interconnect structure 102b. In some embodiments, the connecting pad 104 is extended through the dielectric layer 102a and coupled with the interconnect structure 102b, such that the connecting pad 104 is electrically connected with the interconnect structure 102b. In some embodiments, the connecting pad 104 is electrically connected with the substrate 101 through the RDL 102. In some embodiments, the connecting pad 104 is electrically connected with the substrate 101 through the die pad 101a and the interconnect structure 102b.

In some embodiments, the connecting pad 104 is an under bump metallization (UBM) pad. In some embodiments, the connecting pad 104 includes a solderable surface which serves as a platform for disposing a solder material or the like thereon. In some embodiments, the connecting pad 104 includes a metallurgical layer over the dielectric layer 102a and the interconnect structure 102b. In some embodiments, the connecting pad 104 includes metal or metal alloy. In some embodiments, the connecting pad 104 includes gold, silver, copper, nickel, tungsten, aluminum, palladium and/or alloys thereof. In some embodiments, the connecting pad 104 is in various shapes such as circular shape, quadrilateral shape, polygonal shape or etc. FIG. 1 illustrates the semiconductor structure 100 including two connecting pads 104, however it is understood that the semiconductor structure 100 can include two or more connecting pads 104. It is not intended to limit a number of the connecting pad 104 in the semiconductor structure 100.

In some embodiments, the conductive bump 103 is disposed over the RDL 102 and the substrate 101. In some embodiments, the conductive bump 103 is disposed over and electrically connected with the interconnect structure 102b. In some embodiments, the conductive bump 103 is configured to bond with a conductive structure. In some embodiments, the conductive bump 103 is disposed over and electrically connected with the connecting pad 104. In some embodiments, the conductive bump 103 is electrically connected with the substrate 101 through the die pad 101a and the interconnect structure 102b. In some embodiments, the conductive bump 103 includes low-temperature reflowable material, such as solder, a lead-free solder, etc. In some embodiments, the conductive bump 103 includes lead, tin, copper, gold, nickel or the like or combination thereof. In some embodiments, the conductive bump 103 is a solder ball, a ball grid array (BGA) ball, a controlled collapse chip connection (C4) bump, a microbump, a pillar or the like. In some embodiments, the conductive bump 103 is in a spherical shape. FIG. 1 illustrates the semiconductor structure 100 including two conductive bumps 103, however it is understood that the semiconductor structure 100 can include two or more conductive bumps 103. It is not intended to limit a number of the conductive bump 103 in the semiconductor structure 100.

In some embodiments, the semiconductor structure 100 includes a sidewall 107. In some embodiments, the sidewall 107 is extended vertically along the substrate 101, the passivation 101b and the RDL 102. In some embodiments, the sidewall 107 is extended in a direction from the substrate 101 over the passivation 101b to the dielectric layer 102a. In some embodiments, the sidewall 107 is extended in a direction from the conductive bump 103 to the substrate 101.

In some embodiments, the sidewall 107 surrounds the substrate 101, the passivation 101b, the RDL 102 and the dielectric layer 102a. In some embodiments, the sidewall 107 is substantially orthogonal to the surface 101c of the substrate 101.

In some embodiments, the sidewall 107 includes an extended surface 107a of the substrate 101, an extended surface 107b of the passivation 101b and an extended surface 107c of the dielectric layer 102a. In some embodiments, the extended surface 107a of the substrate 101 is parallel to the extended surface 107b and the extended surface 107c. In some embodiments, the extended surface 107a of the substrate 101 is extended along a side of the substrate 101. In some embodiments, the extended surface 107b of the passivation 101b is extended along a side of the passivation 101b. In some embodiments, the extended surface 107c of the dielectric layer 102a is extended along the RDL 102 or the dielectric layer 102a. In some embodiments, the extended surface 107a of the substrate 101 is coupled with the extended surface 107b of the passivation 101b, and the extended surface 107b of the passivation 101b is coupled with the extended surface 107c of the dielectric layer 102a.

In some embodiments, the sidewall 107 includes several recesses 108 over the sidewall 107. In some embodiments, the recesses 108 are disposed over a portion of the sidewall 107. In some embodiments, the recesses 108 surround the substrate 101, the passivation 101b, the RDL 102 or the dielectric layer 102a. In some embodiments, each recess 108 is extended towards a central portion of the semiconductor structure 100. In some embodiments, the recess 108 is protruded into the substrate 101, the passivation 101b, the RDL 102 or the dielectric layer 102a. In some embodiments, the recesses 108 are disposed over the extended surface 107a of the substrate 101, the extended surface 107b of the passivation 101b or the extended surface 107c of the dielectric layer 102a. In some embodiments, the recesses 108 are cracks which are developed during fabrication of the semiconductor structure such as singulation operations, cutting operations, sawing operations etc. In some embodiments, the recesses 108 are developed by chippings which are formed during fabrication of the semiconductor structure such as singulation operations, cutting operations, sawing operations etc.

In some embodiments, the isolation layer 105 is disposed over a side of the semiconductor structure 100. In some embodiments, the isolation layer 105 is disposed over the sidewall 107 of the semiconductor structure 100. In some embodiments, the isolation layer 105 surrounds the substrate 101 and the RDL 102. In some embodiments, the isolation layer 105 surrounds the substrate 101, the passivation 101b and the dielectric layer 102a. In some embodiments, the isolation layer 105 surrounds the interconnect structure 102b.

In some embodiments, the isolation layer 105 is extended from the substrate 101 over the passivation 101b to the dielectric layer 102a. In some embodiments, the isolation layer 105 is interfaced with the sidewall 107. In some embodiments, the isolation layer 105 is interfaced with the substrate 101, the passivation 101b and the dielectric layer 102a. In some embodiments, the isolation layer 105 is disposed conformal to the sidewall 107. In some embodiments, the isolation layer 105 is extended in a direction vertical to the surface 101c of the substrate 101. In some embodiments, the isolation layer 105 is vertically extended along the substrate 101, the passivation 101 and the dielectric layer 102a.

In some embodiments, the isolation layer 105 is disposed over or interfaced with the extended surface 107a of the substrate 101 and the extended surface 107c of the dielectric layer 102a. In some embodiments, the isolation layer 105 is disposed over or interfaced with the extended surface 107a of the substrate 101, the extended surface 107b of the passivation 101b and the extended surface 107c of the dielectric layer 102a. In some embodiments, the isolation layer 105 is interfaced with the recesses 108, such that the recesses 108 are covered, sealed or filled by the isolation layer 105. Since the isolation layer 105 is disposed over the sidewall 107 to cover or seal the recesses 108, the sidewall 107 can be smoothened by the isolation layer 105, and propagation of cracks from the recesses 108 towards a central portion of the semiconductor structure 100 can be minimized or prevented.

In some embodiments, the isolation layer 105 includes polymer, nitride or oxide. In some embodiments, the isolation layer 105 includes polyimide, polybenzoxazole (PBO), benzocyclobutene (BCB), silicon nitride, silicon oxide or etc. In some embodiments, the isolation layer 105 has a thickness or a width of about 1 um to about 100 um.

In some embodiments, the RDL 102 or the conductive bump 103 disposed over the isolation layer 105 is absent. In some embodiments, the RDL 102 or the conductive bump 103 is not disposed over the isolation layer 105. The RDL 102 or the conductive bump 103 would not present over the isolation layer 105. In some embodiments, the interconnect structure 102b extending over the isolation layer 105 is absent. In some embodiments, the dielectric layer 102a disposed over the isolation layer 105 is absent. In some embodiments, the connecting pad 104 disposed over the isolation layer 105 is absent.

In some embodiments, a top surface 105a of the isolation layer 105 is exposed and is not interfaced with a component. In some embodiments, the top surface 105a is parallel to the surface 101c of the substrate 101 and orthogonal to the sidewall 107. In some embodiments, the top surface 105a is orthogonal to the extended surface 107a of the substrate 101, the extended surface 107b of the passivation 101b or the extended surface 107c of the dielectric layer 102a.

Figure 2:
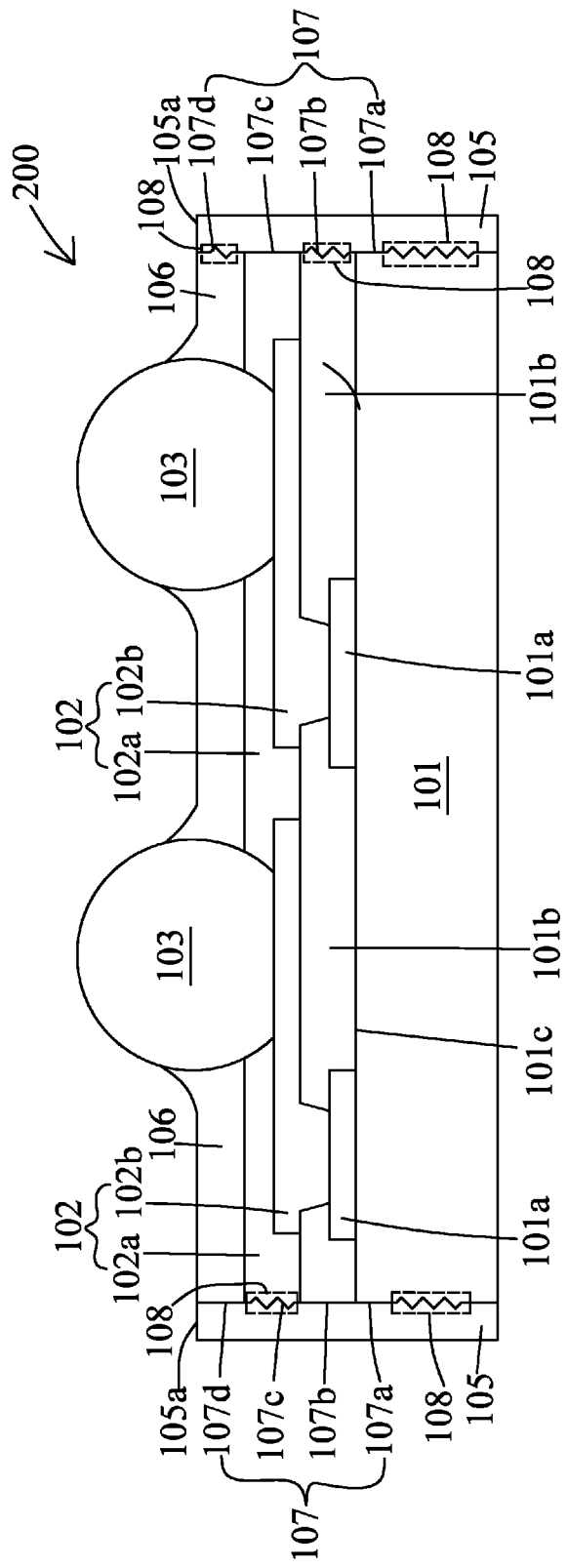
FIG. 2 is a schematic cross-sectional view of a semiconductor structure in accordance with some embodiments of the present disclosure.

FIG. 2 illustrates a semiconductor structure 200 in accordance with various embodiments of the present disclosure. FIG. 2 is a cross-sectional view of the semiconductor structure 200. In some embodiments, the semiconductor structure 200 includes a substrate 101, a die pad 101a, a passivation 101b, a redistribution layer (RDL) 102, a dielectric layer 102a, an interconnect structure 102b and a conductive bump 103, which have similar configuration as described above or illustrated in FIG. 1 of the semiconductor structure 100. In some embodiments, the semiconductor structure 200 is a wafer level chip scale package (WLCSP). In some embodiments, the semiconductor structure 200 is a fan-in device.

In some embodiments, the conductive bump 103 is disposed over and electrically connected with the interconnect structure 102b. In some embodiments, the conductive bump 103 is disposed on the interconnect structure 102b. In some embodiments, the conductive bump 103 is surrounded by the dielectric layer 102a. In some embodiments, an outer surface of the conductive bump 103 is interfaced with the dielectric layer 102a. In some embodiments, the conductive bump 103 is disposed on an elongated portion of the interconnect structure 102b.

In some embodiments, a liquid molding 106 is disposed over the RDL 102. In some embodiments, the liquid molding 106 is disposed over the dielectric layer 102a and surrounds the conductive bump 103. In some embodiments, the outer surface of the conductive bump 103 is interfaced with the liquid molding 106. In some embodiments, the liquid molding 106 is a liquid molding compound (LMC). In some embodiments, the liquid molding 106 includes epoxy, polyimide, polybenzoxazole (PBO), and the like.

In some embodiments, the liquid molding 106 includes an extended surface 107d extended along a side of the liquid molding 106. In some embodiments, the extended surface 107d of the liquid molding 106 is coupled with the extended surface 107c of the dielectric layer 102a. In some embodiments, the extended surface 107d of the liquid molding 106 is parallel to the extended surface 107c of the dielectric layer 102a, the extended surface 107b of the passivation 101b and the extended surface 107a of the substrate 101. In some embodiments, the isolation layer 105 is disposed over or interfaced with the extended surface 107d of the liquid molding 106. In some embodiments, the recesses 108 are disposed over the extended surface 107d of the liquid molding 106, such that the recesses 108 are covered, sealed or filled by the isolation layer 105.

Figure 3:
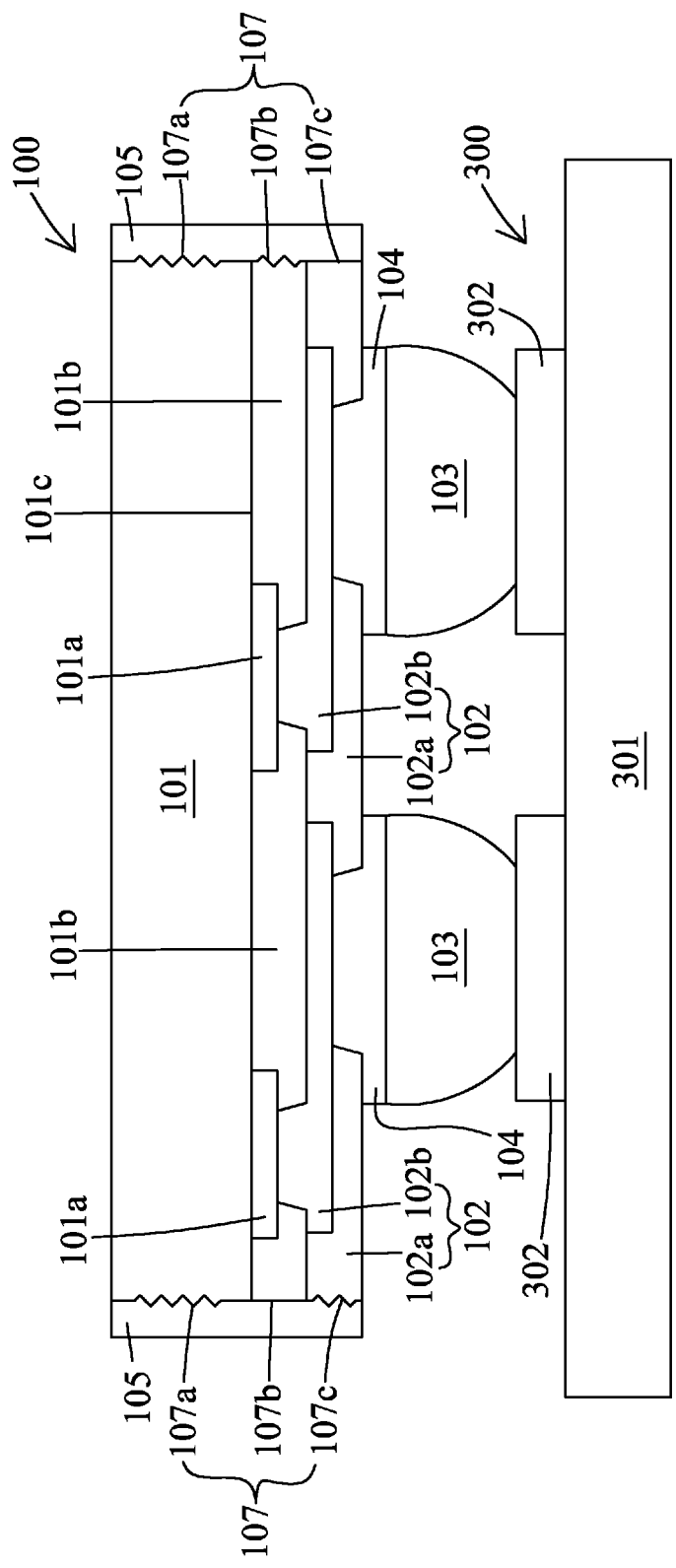
FIG. 3 is a schematic cross-sectional view of a semiconductor structure in accordance with some embodiments of the present disclosure.

FIG. 3 illustrates the semiconductor structure 100 bonded over a semiconductor structure 300. FIG. 3 is a cross-sectional view of the semiconductor structure 100 and the semiconductor structure 300. In some embodiments, the semiconductor structure 100 has similar configuration as described above or illustrated in FIG. 1. In some embodiments, the semiconductor structure 100 is bonded with the semiconductor structure 300, such that a circuitry of the semiconductor structure 100 is electrically connected with a circuitry of the semiconductor structure 300. In some embodiments, the semiconductor structure 100 is flipped and mounted on the semiconductor structure 300.

In some embodiments, the semiconductor structure 300 is a printed circuit board (PCB) including several circuitries thereon. In some embodiments, the semiconductor structure 300 includes a substrate 301 and a bond pad 302 disposed over the substrate 301. In some embodiments, the substrate 301 includes electrical components or circuitries thereon. In some embodiments, the substrate 301 includes semiconductive material such as silicon or the like. In some embodiments, the bond pad 302 is disposed over the substrate 301 and configured to receive a conductive structure. In some embodiments, the bond pad 302 includes conductive material such as copper, aluminum, silver, gold or the like. In some embodiments, the conductive bump 103 of the semiconductor structure 100 is disposed over and bond with the bond pad 302 of the semiconductor structure 300, such that the semiconductor structure 100 is electrically connected with the semiconductor structure 300.

Figure 4:
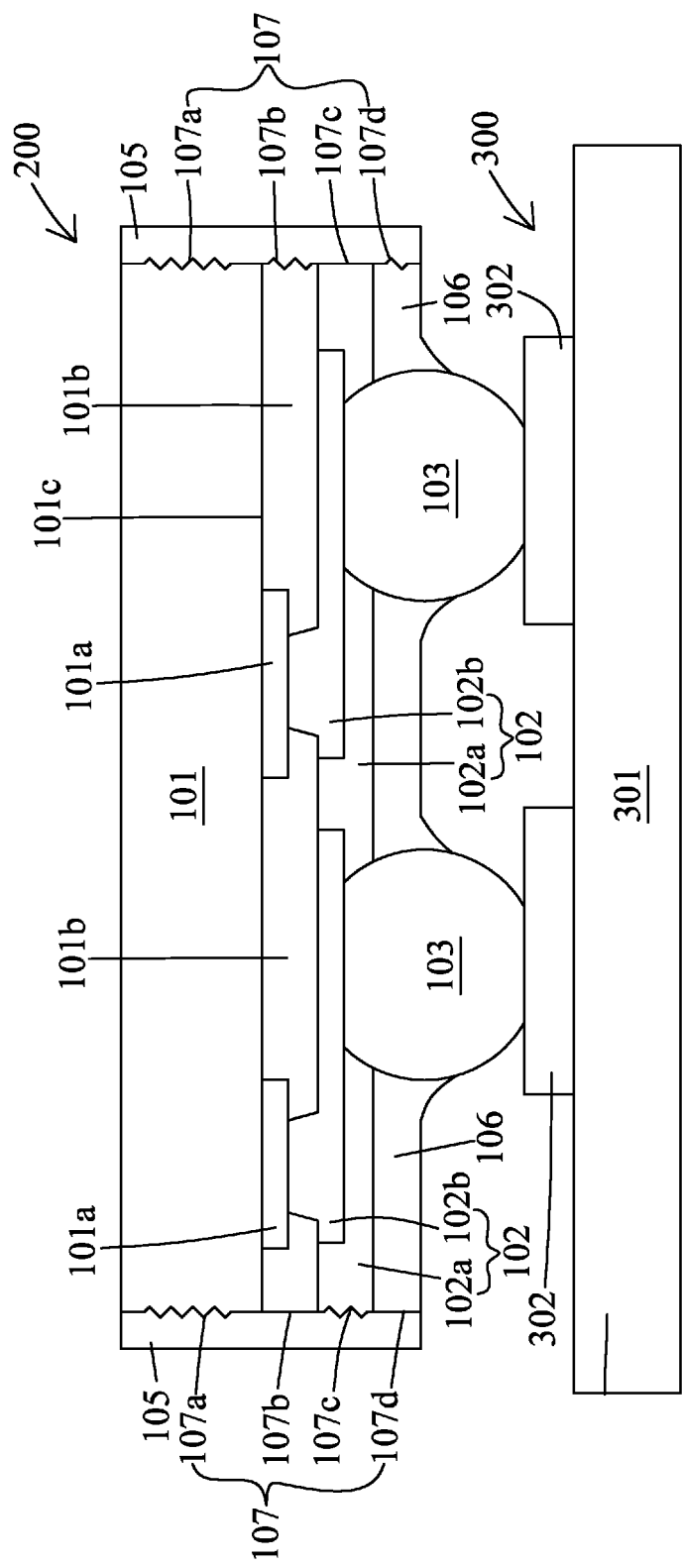
FIG. 4 is a schematic cross-sectional view of a semiconductor structure in accordance with some embodiments of the present disclosure.

FIG. 4 illustrates the semiconductor structure 200 bonded over the semiconductor structure 300. FIG. 4 is a cross-sectional view of the semiconductor structure 200 and the semiconductor structure 300. In some embodiments, the semiconductor structure 200 has similar configuration as described above or illustrated in FIG. 2. In some embodiments, the semiconductor structure 300 has similar configuration as described above or illustrated in FIG. 3. In some embodiments, the semiconductor structure 200 is bonded with the semiconductor structure 300, such that a circuitry of the semiconductor structure 200 is electrically connected with a circuitry of the semiconductor structure 300. In some embodiments, the semiconductor structure 200 is flipped and mounted on the semiconductor structure 300. In some embodiments, the conductive bump 103 of the semiconductor structure 200 is disposed over and bond with the bond pad 302 of the semiconductor structure 300, such that the semiconductor structure 200 is electrically connected with the semiconductor structure 300.

Figure 5:
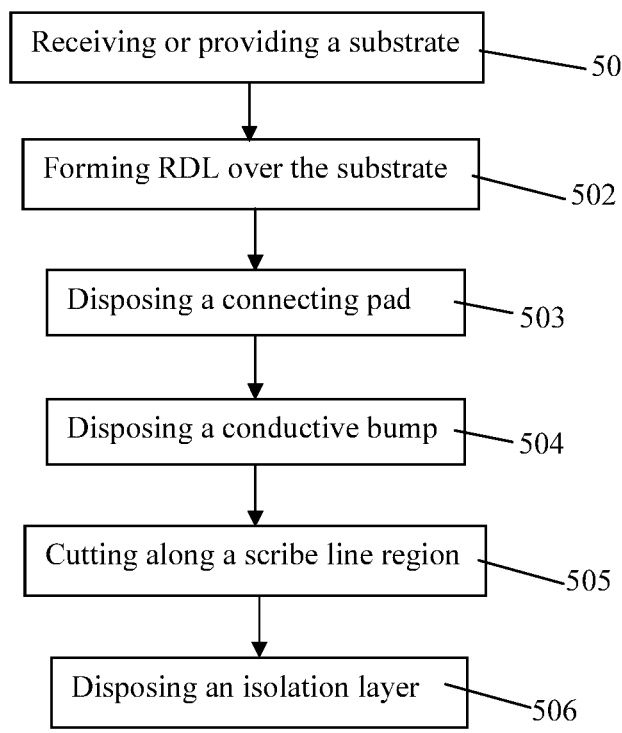
FIG. 5 is a flow diagram of a method of manufacturing a semiconductor structure in accordance with some embodiments of the present disclosure.

In some embodiments, a semiconductor structure 100 is formed by a method 500. The method 500 includes a number of operations and the description and illustration are not deemed as a limitation as the sequence of the operations. FIG. 5 is an embodiment of the method 500 of manufacturing the semiconductor structure 100. The method 500 includes a number of operations (501, 502, 503, 504, 505 and 506).

In operation 501, a substrate 101 is received or provided as shown in FIG. 5A. In some embodiments, a semiconductive wafer includes the substrate 101. In some embodiments, the semiconductive wafer is in a circular shape. In some embodiments, the substrate 101 includes semiconductive material such as silicon or the like. In some embodiments, the substrate 101 includes a die pad 101*a* and a passivation 101*b*. In some embodiments, the die pad 101*a* is disposed over the substrate 101. In some embodiments, there are more than one die pad 101*a* disposed over the substrate 101.

In some embodiments, the passivation 101*b* is disposed over the substrate 101 and surrounds the die pad 101*a*. In some embodiments, the passivation 101*b* includes dielectric material such as polymer or the like. In some embodiments, the passivation 101*b* is disposed by deposition or any other suitable operations. In some embodiments, the passivation 101*b* is patterned by photolithography, etching or any other suitable operations, such that a portion of the die pad 101*a* is exposed. In some embodiments, the passivation 101*b* is disposed over the substrate 101, and then a portion of the passivation 101*b* disposed over the die pad 101*a* is removed, such that the portion of the die pad 101*a* is exposed for receiving a conductive structure.

Figure 5C:
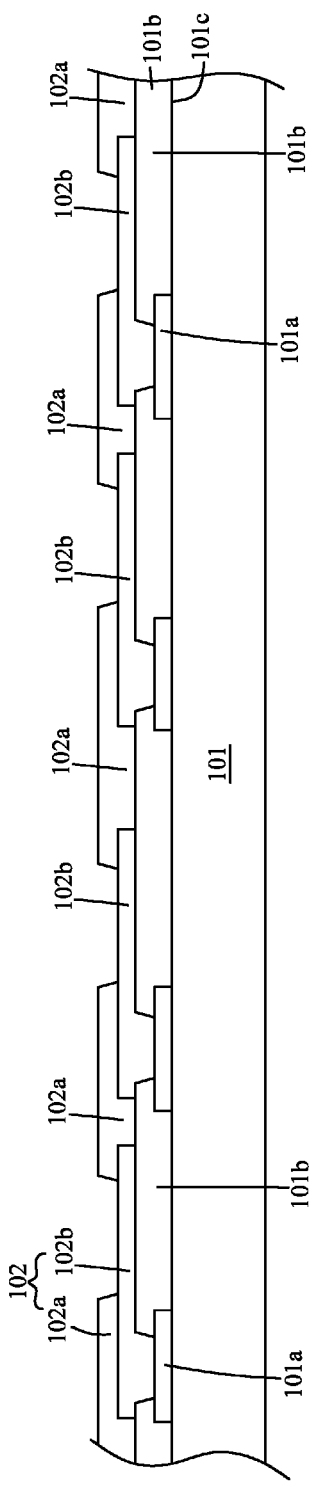

In operation 502, a RDL 102 is formed as shown in FIGS. 5B and 5C. In some embodiments, the RDL 102 is disposed over the substrate 101. In some embodiments, the RDL 102 is formed over the passivation 101*b*. In some embodiments, the RDL 102 includes a dielectric layer 102*a* disposed over the passivation 101*b* and an interconnect structure 102*b* disposed within the dielectric layer 102*a* and electrically connected with the die pad 101*a*. In some embodiments, the formation of the RDL 102 includes forming the interconnect structure 102*b* over the passivation 101*b* as show in FIG. 5B and disposing the dielectric layer of a dielectric layer 102*a* as shown in FIG. 5C.

In some embodiments, the interconnect structure 102*b* is formed over the passivation 101*b* and is electrically connected with a portion of the die pad 101*a* exposed from the passivation 101*b*. In some embodiments, the interconnect structure 102*b* includes an elongated portion extending over the passivation 101*b* and a via portion extending through the passivation 101*b* to couple with the die pad 101*a*. In some embodiments, the interconnect structure 102*b* is formed by any suitable operations such as sputtering, electroplating or the like.

In some embodiments, the dielectric layer 102*a* is disposed over the passivation 101*b* and is patterned to expose a portion of the interconnect structure 102*b*. In some embodiments, the dielectric layer 102*a* is disposed by any suitable operation such as chemical vapor deposition (CVD), spin coating, oxidation or the like. In some embodiments, the dielectric layer 102*a* is patterned by any suitable operation such as photolithography, etching or the like. In some embodiments, a portion of the dielectric layer 102*a* disposed over a portion of the elongated portion of the interconnect structure 102*b* is removed, such that the portion of the elongated portion of the interconnect structure 102*b* is exposed from the dielectric layer 102*a*. In some embodiments, the interconnect structure 102*b* is partially covered by the dielectric layer 102*a*.

Figure 5D:
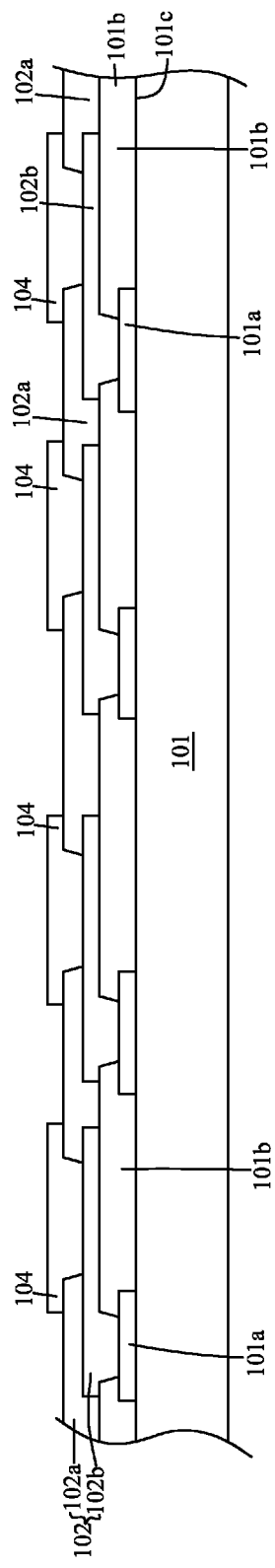

In operation 503, a connecting pad 104 is disposed over the interconnect structure 102*b* as shown in FIG. 5D. In some embodiments, the connecting pad 104 is disposed over the dielectric layer 102*a* and electrically connected with the interconnect structure 102*b*. In some embodiments, the connecting pad 104 is coupled with a portion of the interconnect structure 102*b* exposed from the dielectric layer 102*a*. In some embodiments, the connecting pad 104 is disposed by any suitable operations such as evaporation, sputtering or electroplating or the like. In some embodiments, the connecting pad 104 is a UBM pad. In some embodiments, the die pad 101*a*, the interconnect structure 102*b* and the connecting pad 104 are electrically connected.

Figure 5E:
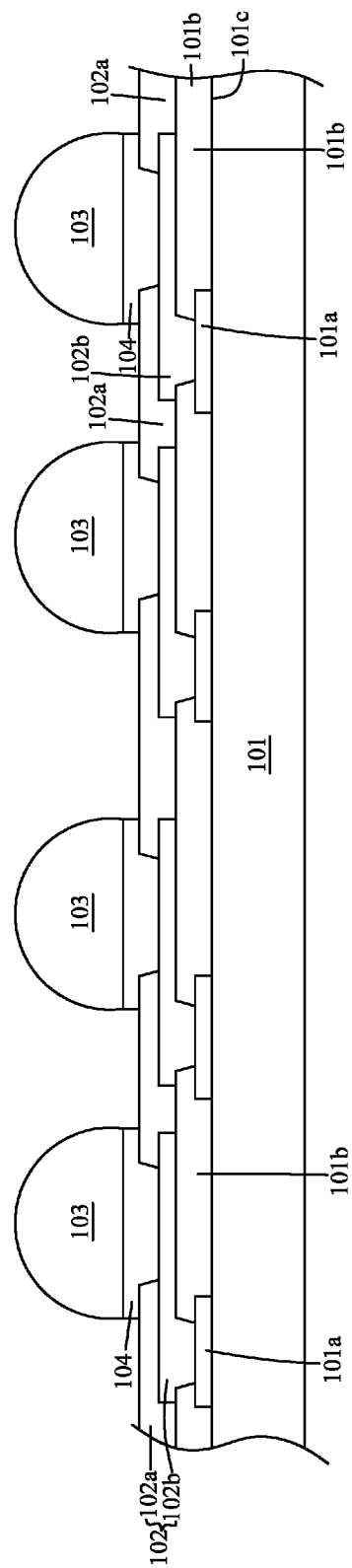

In operation 504, a conductive bump 103 is disposed over the interconnect structure 102*b* as shown in FIG. 5E. In some embodiments, the conductive bump 103 is mounted over the connecting pad 104. In some embodiments, the conductive bump 103 is disposed over the connecting pad 104 by attaching a solder material over the connecting pad 104 and then reflowing the solder material. In some embodiments, the conductive bump 103 is disposed over the connecting pad 104 by pasting the solder material over a stencil. In some embodiments, the conductive bump 103 is formed over the connecting pad 104 by any suitable operations such as ball mounting, stencil pasting or the like. In some embodiments, the conductive bump 103 is electrically connected with the connecting pad 104, the interconnect structure 102*b* and the die pad 101*a*. In some embodiments, the conductive bump 103 is configured to bond with a conductive structure or another substrate.

Figure 5F:
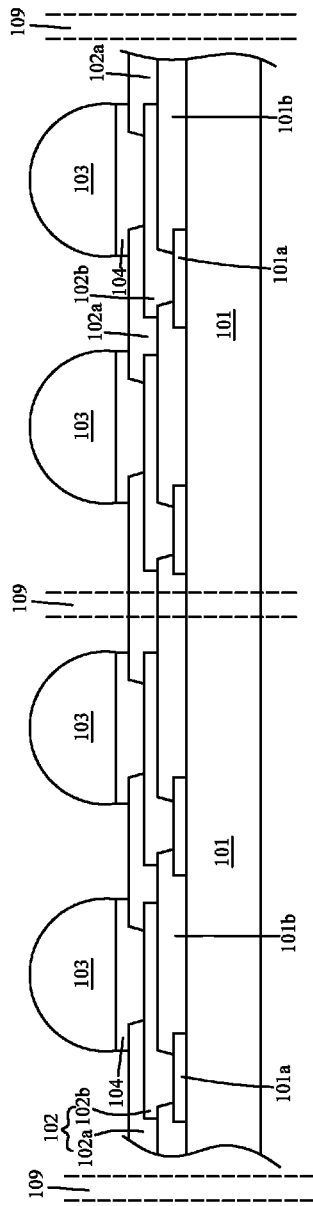
Figure 5G:
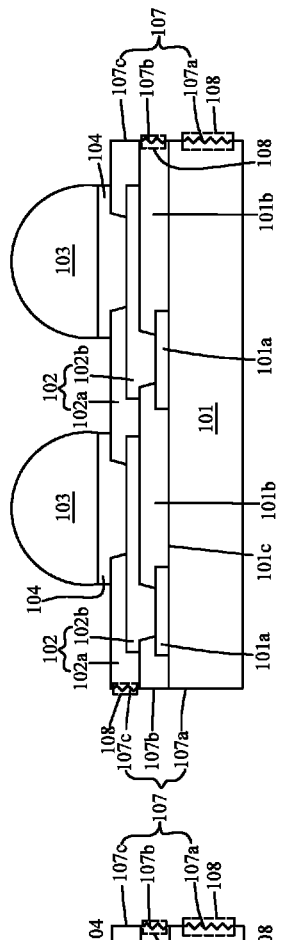
Figure 5H:
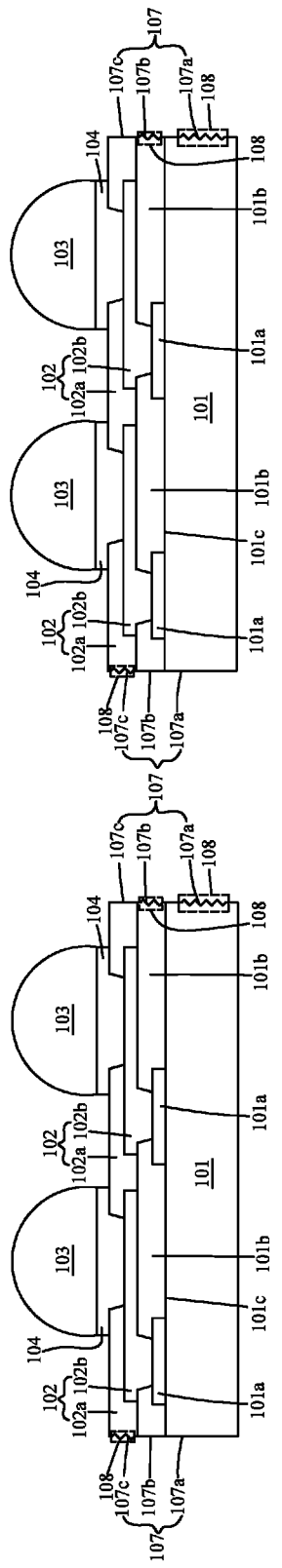

In operation 505, the semiconductive wafer including the substrate 101 is cut along a scribe line region 109 to singulate several semiconductor structures as shown in FIGS. 5F-5H. In some embodiments, the semiconductive wafer including the substrate 101 is defined with a scribe line region 109 as shown in FIG. 5F to divide the semiconductive wafer into several device areas. In some embodiments, the semiconductive wafer is sawn along the scribe line region 109 so as to singulate several semiconductor structures as shown in FIGS. 5G and 5H. Although only two semiconductor structures as shown in FIGS. 5G and 5H are singulated from the semiconductive wafer as shown in FIG. 5F, it is understood that two or more semiconductor structures can be singulated from the semiconductive wafer. It is not intended to limit a number of the semiconductor structure being manufactured. In some embodiments, the semiconductor structures as shown in FIGS. 5G and 5H have similar configuration with each other.

In some embodiments, several recesses 108 are formed over a sidewall 107 of the semiconductor structure as shown in FIGS. 5G and 5H. In some embodiments, the sidewall 107 of the semiconductor structure is formed after cutting the semiconductive wafer along the scribe line region 109. In some embodiments, the sidewall 107 includes an extended surface 107*a* of the substrate 101, an extended surface 107*b* of the passivation 101*b* and an extended surface 107*c* of the dielectric layer 102*a*.

In some embodiments, the recesses 108 such as cracks are formed during the cutting of the semiconductive wafer along the scribe line region 109. In some embodiments, the recesses 108 are formed by cutting along the sidewall 107 of the semiconductor structure. In some embodiments, the recesses 108 are formed over a portion of the sidewall 107 of the semiconductor structure. In some embodiments, the recesses 108 are formed over the extended surface 107a of the substrate 101, the extended surface 107b of the passivation 101b or the extended surface 107c of the dielectric layer 102a.

In operation 506, an isolation layer 105 is disposed to surround the substrate 101 and the RDL 102 of the semiconductor structure as shown in FIG. 5I. In some embodiments, the isolation layer 105 is disposed over the sidewall 107 of the semiconductor structure after the cutting or the formation of the recesses 108. In some embodiments, the isolation layer 105 is disposed over the sidewall 107 of each of the semiconductor structures. In some embodiments, the sidewall 107 of the semiconductor structure is coated with the isolation layer 105. In some embodiments, the isolation layer 105 is disposed over or interfaced with the extended surface 107a of the substrate 101, the extended surface 107b of the passivation 101b or the extended surface 107c of the dielectric layer 102a.

In some embodiments, the isolation layer 105 is disposed over the sidewall 107 of the semiconductor structure by any suitable operations such as CVD, physical vapor deposition (PVD), spraying or the like. In some embodiments, the isolation layer 105 is disposed conformal to the sidewall 107. In some embodiments, the recesses 108 are sealed and filled by the isolation layer 105, as such the sidewall 107 of the semiconductor structure is smoothened after disposing the isolation layer 105 over the sidewall 107. In some embodiments, the semiconductor structure 100 is formed after disposing the isolation layer 105 as shown in FIG. 5I, which has similar configuration as the semiconductor structure 100 as shown in FIG. 1.

In some embodiments, another semiconductor structure 300 is received or provided as shown in FIG. 5J. In some embodiments, the semiconductor structure 100 is mounted over and bonded with another semiconductor structure 300. In some embodiments, the semiconductor structure 100 is electrically connected with the semiconductor structure 300. In some embodiments, the semiconductor structure 300 includes a substrate 301 and a bond pad 302. In some embodiments, the conductive bump 103 of the semiconductor structure 100 is bonded with the bond pad 302 of the semiconductor structure 300, such that the substrate 101 is electrically connected with the substrate 301 through the conductive bump 103 and the bond pad 302.

Figure 6:
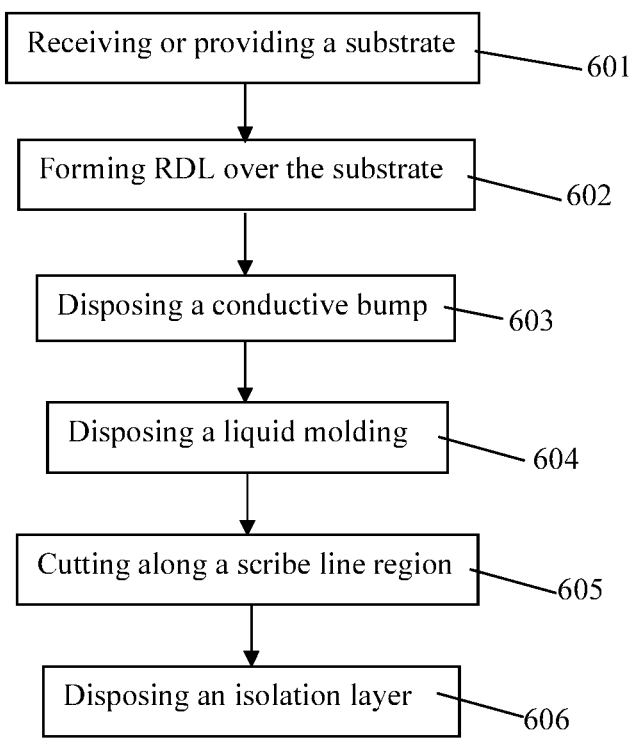
FIG. 6 is a flow diagram of a method of manufacturing a semiconductor structure in accordance with some embodiments of the present disclosure.

In some embodiments, a semiconductor structure 200 is formed by a method 600. The method 600 includes a number of operations and the description and illustration are not deemed as a limitation as the sequence of the operations. FIG. 6 is an embodiment of the method 600 of manufacturing the semiconductor structure 200. The method 600 includes a number of operations (601, 602, 603, 604, 605 and 606).

Figure 6C:
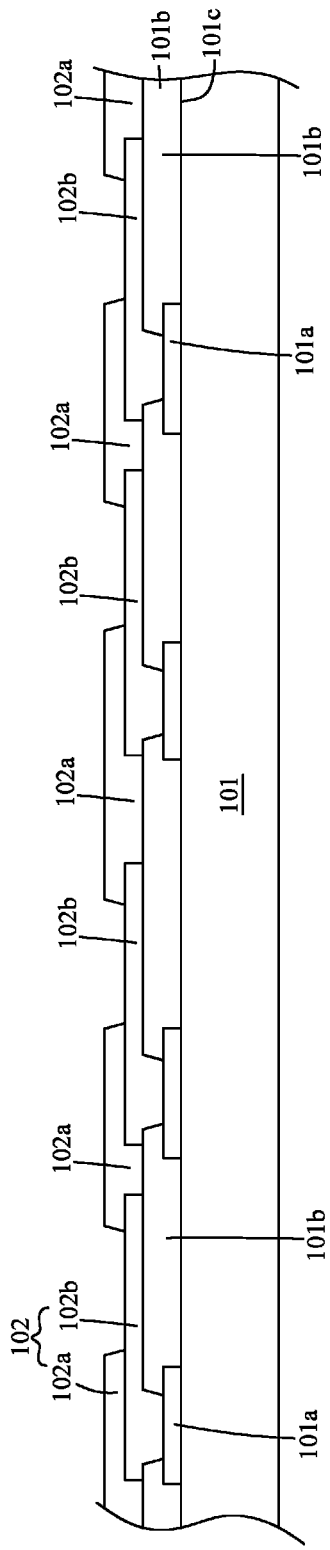

In operation 601, a substrate 101 is received or provided as shown in FIG. 6A. In some embodiments, the operation 601 is similar to the operation 501. In operation 602, a RDL 102 is formed as shown in FIGS. 6B and 6C. In some embodiments, the operation 601 is similar to the operation 502.

Figure 6D:
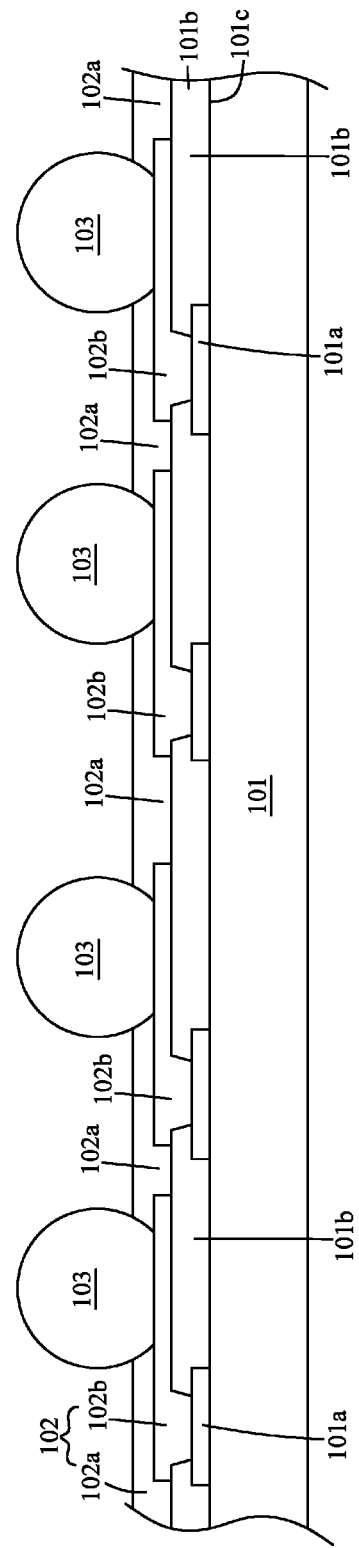

In operation 603, a conductive bump 103 is disposed over the interconnect structure 102b as shown in FIG. 6D. In some embodiments, the conductive bump 103 is mounted over the interconnect structure 102b. In some embodiments, the conductive bump 103 is disposed over the interconnect structure 102b by attaching a solder material over the interconnect structure 102b and then reflowing the solder material. In some embodiments, the conductive bump 103 is disposed over the interconnect structure 102b by pasting the solder material over a stencil. In some embodiments, the conductive bump 103 is formed over the interconnect structure 102b by any suitable operations. In some embodiments, the conductive bump 103 is electrically connected with the interconnect structure 102b and the die pad 101a. In some embodiments, the conductive bump 103 is configured to bond with a conductive structure or another substrate.

Figure 6E:
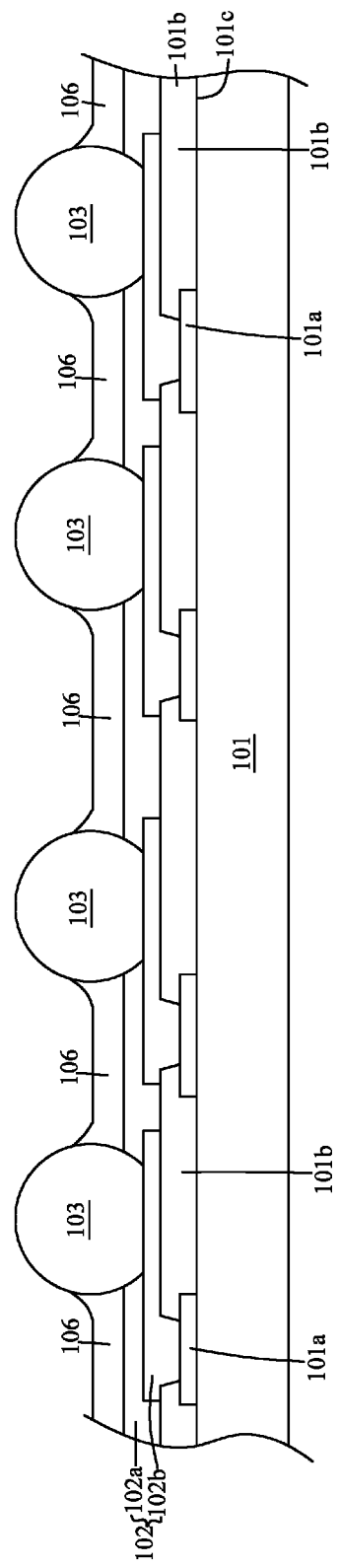

In operation 604, a liquid molding 106 is disposed over the dielectric layer 102a and surrounds the conductive bump 103 as shown in FIG. 6E. In some embodiments, a molding material such as epoxy is disposed and then cured to form the liquid molding 106. In some embodiments, the liquid molding 106 is formed conformal to the dielectric layer 102a and a portion of an outer surface of the conductive bump 103, so that the conductive bump 103 is partially protruded from the liquid molding 106.

In operation 605, the semiconductive wafer including the substrate 101 is cut along a scribe line region 109 to singulate several semiconductor structures as shown in FIGS. 6F-6H. In some embodiments, the operation 605 is similar to the operation 505. In some embodiments, the semiconductor structures as shown in FIGS. 6G and 6H have similar configuration with each other.

In some embodiments, several recesses 108 are formed over a sidewall 107 of the semiconductor structure as shown in FIGS. 6G and 6H. In some embodiments, the sidewall 107 of the semiconductor structure is formed after cutting the semiconductive wafer along the scribe line region 109. In some embodiments, the sidewall 107 includes an extended surface 107a of the substrate 101, an extended surface 107b of the passivation 101b, an extended surface 107c of the dielectric layer 102a and an extended surface 107d of the liquid molding 106. In some embodiments, the recesses 108 are formed over the extended surface 107a of the substrate 101, the extended surface 107b of the passivation 101b, the extended surface 107c of the dielectric layer 102a, or the extended surface 107d of the liquid molding 106.

In operation 606, an isolation layer 105 is disposed to surround the substrate 101 and the RDL 102 of the semiconductor structure as shown in FIG. 6I. In some embodiments, the operation 606 is similar to the operation 506. In some embodiments, the isolation layer 105 is disposed over the sidewall 107 of the semiconductor structure after the cutting or the formation of the recesses 108. In some embodiments, the isolation layer 105 is disposed over the sidewall 107 of each of the semiconductor structures. In some embodiments, the isolation layer 105 is disposed over or interfaced with the extended surface 107a of the substrate 101, the extended surface 107b of the passivation 101b, the extended surface 107c of the dielectric layer 102a or the extended surface 107d of the liquid molding 106. In some embodiments, the recesses 108 are sealed and filled by the isolation layer 105, as such the sidewall 107 of the semiconductor structure is smoothened after disposing the isolation layer 105 over the sidewall 107. In some embodiments, the semiconductor structure 200 is formed after disposing the isolation layer 105 as shown in FIG. 6I, which has similar configuration as the semiconductor structure 200 as shown in FIG. 2.

In some embodiments, another semiconductor structure 300 is received or provided as shown in FIG. 6J. In some embodiments, the semiconductor structure 200 is mounted over and bonded with another semiconductor structure 300. In some embodiments, the semiconductor structure 200 is electrically connected with the semiconductor structure 300. In some embodiments, the semiconductor structure 300 includes a substrate 301 and a bond pad 302. In some embodiments, the conductive bump 103 of the semiconductor structure 200 is bonded with the bond pad 302 of the semiconductor structure 300, such that the substrate 101 is electrically connected with the substrate 301 through the conductive bump 103 and the bond pad 302.

In the present disclosure, a semiconductor structure includes an isolation layer disposed over a sidewall of a semiconductor structure. The semiconductor structure is sawn upon singulation, and several recesses or cracks are formed over the sidewall during the singulation. The sidewall is covered by the isolation layer, such that the recesses are sealed by the isolation layer. Such configuration can minimize or prevent propagation of the recesses towards a central portion of the semiconductor structure.

In some embodiments, a semiconductor structure includes a substrate including a die pad disposed over the substrate, and a passivation disposed over the substrate and surrounding the die pad, a redistribution layer (RDL) including a dielectric layer disposed over the passivation and an interconnect structure disposed within the dielectric layer and electrically connecting with the die pad, a conductive bump disposed over and electrically connected with the interconnect structure, and an isolation layer surrounding the substrate and the RDL.

In some embodiments, the isolation layer is interfaced with the dielectric layer. In some embodiments, the isolation layer surrounds the interconnect structure. In some embodiments, the isolation layer is extended from the substrate over the passivation to the dielectric layer. In some embodiments, the isolation layer is interfaced with a sidewall of the semiconductor structure extending in a direction from the substrate over the passivation to the dielectric layer. In some embodiments, the sidewall of the semiconductor structure comprises an extended surface of the substrate, an extended surface of the passivation parallel to the extended surface of the substrate, and an extended surface of the dielectric layer parallel to the extended surface of the substrate. In some embodiments, the extended surface of the substrate is coupled with the extended surface of the passivation, and the extended surface of the passivation is coupled with the extended surface of the dielectric layer. In some embodiments, the isolation layer includes polymer, nitride or oxide. In some embodiments, the isolation layer has a thickness of about 1 um to about 100 um. In some embodiments, the conductive bump or the interconnect structure disposed over the isolation layer is absent. In some embodiments, the semiconductor structure is a fan-in device. In some embodiments, the semiconductor structure further includes a plurality of recesses surrounding the substrate, the passivation or the dielectric layer.

In some embodiments, a semiconductor structure includes a substrate including a die pad disposed over the substrate and a passivation disposed over the substrate and partially covering the die pad, a redistribution layer (RDL) including a dielectric layer disposed over the passivation and an interconnect structure disposed within the dielectric layer and electrically connected with the die pad, and a conductive bump disposed over and electrically connected with the interconnect structure, wherein the semiconductor structure includes a sidewall extending along the substrate, the passivation and the dielectric layer, and an isolation layer is disposed on the sidewall.

In some embodiments, the isolation layer surrounds the substrate, the passivation and the RDL. In some embodiments, the semiconductor structure is mounted over a second substrate, and the conductive bump is bonded with the second substrate. In some embodiments, the semiconductor structure further includes a plurality of recesses disposed over a portion of the sidewall, and the plurality of recesses are interfaced with the isolation layer.

In some embodiments, a method of manufacturing a semiconductor structure includes receiving a substrate including a die pad disposed over the substrate and a passivation disposed over the substrate and surrounding the die pad, forming a RDL over the passivation, wherein the RDL includes a dielectric layer disposed over the passivation and an interconnect structure disposed within the dielectric layer and electrically connected with the die pad, disposing a conductive bump over the interconnect structure, and disposing an isolation layer to surround the substrate and the RDL.

In some embodiments, a sidewall of the semiconductor structure is coated with the isolation layer by spraying operations. In some embodiments, the method further includes cutting along a sidewall of the semiconductor structure to form a plurality of recesses over a portion of the sidewall of the semiconductor structure, prior to the disposing the isolation layer. In some embodiments, the method further includes mounting the semiconductor structure over a second substrate, and bonding the conductive bump with the second substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate comprising a die pad disposed over the substrate and a passivation disposed over the substrate and surrounding the die pad;
   a redistribution layer (RDL) comprising a dielectric layer disposed on the passivation and an interconnect structure disposed within the dielectric layer and electrically connecting with the die pad;
   a conductive bump disposed over and electrically connected with the interconnect structure;
   an isolation layer directly contacted with the substrate, the passivation and the dielectric layer; and
   a plurality of recesses formed over at least a sidewall of the substrate, wherein the isolation layer is directly contacted with the sidewall of the substrate at the plurality of recesses.

2. The semiconductor structure of claim 1, wherein the isolation layer is vertically extended along the substrate, the passivation and the dielectric layer.

3. The semiconductor structure of claim 1, wherein the isolation layer surrounds the interconnect structure.

4. The semiconductor structure of claim 1, wherein the isolation layer is extended from the substrate over the passivation to the dielectric layer.

5. The semiconductor structure of claim 1, wherein the isolation layer is interfaced with a sidewall of the semiconductor structure extending in a direction from the substrate over the passivation to the dielectric layer.

6. The semiconductor structure of claim 5, wherein the sidewall of the semiconductor structure comprises the sidewall of the substrate, a sidewall of the passivation, and a sidewall of the dielectric layer of the RDL.

7. The semiconductor structure of claim 6, wherein the sidewall of the substrate is coupled with the sidewall of the passivation, and the sidewall of the passivation is coupled with the sidewall of the dielectric layer of the RDL.

8. The semiconductor structure of claim 1, wherein the isolation layer includes polymer, nitride or oxide.

9. The semiconductor structure of claim 1, wherein the isolation layer has a thickness of about 1 um to about 100 um.

10. The semiconductor structure of claim 1, wherein the conductive bump or the interconnect structure disposed over the isolation layer is absent.

11. The semiconductor structure of claim 1, wherein the semiconductor structure is a fan-in device.

12. The semiconductor structure of claim 1, wherein the plurality of recesses are further formed over a sidewall of the dielectric layer.

13. A semiconductor structure, comprising:
   a substrate comprising a die pad disposed over the substrate and a passivation disposed over the substrate and surrounding the die pad;
   a redistribution layer (RDL) comprising a dielectric layer disposed on the passivation and an interconnect structure disposed within the dielectric layer and electrically connected with the die pad;
   a conductive bump disposed over and electrically connected with the interconnect structure;
   a plurality of recesses formed over a sidewall of the substrate and a sidewall of the passivation; and
   an isolation layer directly contacted with the sidewall of the substrate at the plurality of recesses and the sidewall of the passivation at the plurality of recesses.

14. The semiconductor structure of claim 13, wherein the isolation layer surrounds the substrate, the passivation and the RDL.

15. The semiconductor structure of claim 13, wherein the conductive bump disposed over the sidewall and the isolation layer is absent, or the interconnect structure disposed over the sidewall and the isolation layer is absent.

16. The semiconductor structure of claim 13, wherein the plurality of recesses are further formed over a sidewall of the RDL, and the isolation layer is directly contacted with the sidewall of the RDL at the plurality of recesses.

17. A semiconductor structure, comprising:
   a substrate comprising a die pad disposed over the substrate and a passivation disposed over the substrate and surrounding the die pad;
   a redistribution layer (RDL) comprising a dielectric layer disposed on the passivation and an interconnect structure disposed within the dielectric layer and electrically connecting with the die pad;
   an isolation layer directly contacted with the substrate, the passivation and the dielectric layer; and
   a plurality of recesses formed over a sidewall of the substrate and a sidewall of the dielectric layer of the RDL, wherein the isolation layer is directly contacted with the sidewall of the substrate at the plurality of recesses and the sidewall of the dielectric layer of the RDL at the plurality of recesses.

18. The semiconductor structure of claim 17, wherein the isolation layer and the plurality of recesses over the sidewall of the substrate form an interface recessed towards the substrate or the isolation layer.

19. The semiconductor structure of claim 17, wherein the isolation layer and the plurality of recesses over the sidewall of the dielectric layer of the RDL form an interface recessed towards the dielectric layer or the isolation layer.

20. The semiconductor structure of claim 17, wherein the isolation layer surrounds the substrate and the dielectric layer.

* * * * *